United States Patent
Kudou

(10) Patent No.: US 9,711,353 B2
(45) Date of Patent: Jul. 18, 2017

(54) METHOD FOR MANUFACTURING COMPOUND SEMICONDUCTOR EPITAXIAL SUBSTRATES INCLUDING HEATING OF CARRIER GAS

(71) Applicant: Panasonic Corporation, Osaka (JP)

(72) Inventor: Chiaki Kudou, Toyama (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/004,004

(22) Filed: Jan. 22, 2016

(65) Prior Publication Data

US 2016/0240369 A1  Aug. 18, 2016

(30) Foreign Application Priority Data

Feb. 13, 2015  (JP) .................................. 2015-026463

(51) Int. Cl.
H01L 21/02 (2006.01)
C23C 16/32 (2006.01)
C23C 16/455 (2006.01)

(52) U.S. Cl.
CPC ........ *H01L 21/0262* (2013.01); *C23C 16/325* (2013.01); *C23C 16/455* (2013.01); *C23C 16/4557* (2013.01); *C23C 16/45512* (2013.01); *H01L 21/02378* (2013.01); *H01L 21/02529* (2013.01); *H01L 21/02579* (2013.01)

(58) Field of Classification Search
CPC ......... H01L 21/02365; H01L 21/02612; H01L 21/02617; H01L 21/02274; H01L 21/0228; H01L 21/02293
See application file for complete search history.

(56) References Cited

U.S. PATENT DOCUMENTS 5,254,370 A    10/1993  Nagasawa et al.
6,297,522 B1 *  10/2001  Kordina ............... C23C 16/325
                                                              148/33
7,928,019 B2 *   4/2011  Surthi ............... C23C 16/45546
                                                              438/770

FOREIGN PATENT DOCUMENTS

JP    5-001380     1/1993
JP    2002-508298  3/2002
JP    2003-507319  2/2003
(Continued)

OTHER PUBLICATIONS

A. Schoner et al., "Highly Uniform Epitaxial SiC-Layers Grown in a Hot-Wall CVD Reactor with Mechanical Rotation", Materials Science Forum, vols. 389-393 (2002), pp. 187-190.*
(Continued)

*Primary Examiner* — Andrew Q Tran
(74) *Attorney, Agent, or Firm* — McDermott Will & Emery LLP

(57) ABSTRACT

An aspect of the present disclosure resides in a method for manufacturing a compound semiconductor epitaxial substrate including a substrate and a compound semiconductor epitaxial layer disposed on the substrate, the method including providing the substrate, heating a carrier gas, preparing a mixed gas by mixing the heated carrier gas with at least a portion of a source gas that is a source for the compound semiconductor epitaxial layer, the source gas having a lower temperature than the heated carrier gas, and forming the compound semiconductor epitaxial layer on the substrate by supplying the mixed gas onto the substrate.

9 Claims, 13 Drawing Sheets

(56) References Cited

FOREIGN PATENT DOCUMENTS

| | | | | |
|---|---|---|---|---|
| JP | 2005-093478 | 4/2005 | | |
| JP | 2005-317670 | 11/2005 | | |
| JP | 2005317670 | * 11/2005 | ........... | H01L 21/205 |
| JP | 2006-036613 | 2/2006 | | |
| JP | 2006036613 | * 2/2006 | ........... | H01L 21/205 |
| JP | 2012-151400 | 8/2012 | | |
| JP | 2014-019596 | 2/2014 | | |
| WO | 99/31306 | 6/1999 | | |
| WO | 01/14619 | 3/2001 | | |

OTHER PUBLICATIONS

A. Schoner et al., "Highly Uniform Epitaxial SiC-Layers Grown in a Hot-Wall CVD Reactor with Mechanical Rotation" Materials Science Forum vols. 389-393(2002) pp. 187-190.

* cited by examiner

METHOD FOR MANUFACTURING COMPOUND SEMICONDUCTOR EPITAXIAL SUBSTRATES INCLUDING HEATING OF CARRIER GAS

BACKGROUND

1. Technical Field

The present disclosure relates to a chemical vapor deposition (CVD) apparatus for depositing compound semiconductors and to a method for manufacturing compound semiconductor epitaxial substrates such as of, for example, silicon carbide semiconductors.

2. Description of the Related Art

Wide bandgap semiconductors are used in various semiconductor devices such as power devices (power elements), environment resistant devices, high-temperature devices and high-frequency devices. In particular, the application of attention is to power devices such as switching devices and rectifying devices.

Of the wide bandgap semiconductors, silicon carbide (SiC) is relatively easy to form into substrates. Further, the thermal oxidation of this semiconductor material gives silicon dioxide ($SiO_2$) films that are good gate insulators. These benefits make SiC attractive for use in the development of power devices (see, for example, Japanese Unexamined Patent Application Publication No. 2012-151400).

Some of the typical switching devices using SiC are metal insulator semiconductor field effect transistors (hereinafter, "MISFET") and metal semiconductor field effect transistors (hereinafter, "MESFET").

SiC crystals are generally grown by a CVD method. For example, Japanese Unexamined Patent Application Publication No. 5-001380, Japanese Unexamined Patent Application Publication (Translation of PCT Application) No. 2003-507319, and Materials Science Forum Vols. 389-393 (2002) pp. 187-190 disclose methods for forming SiC epitaxial layers on substrates using a hot-wall CVD apparatus. Further, Materials Science Forum Vols. 389-393 (2002) pp. 187-190, and Japanese Unexamined Patent Application Publication (Translation of PCT Application) No. 2003-507319 propose that SiC is epitaxially grown while rotating the substrate in order to enhance the uniformity of the SiC epitaxial layer.

SUMMARY

In one general aspect, the techniques disclosed here feature a method for manufacturing a compound semiconductor epitaxial substrate including a substrate and a compound semiconductor epitaxial layer disposed on the substrate, the method including providing the substrate, heating a carrier gas, preparing a mixed gas by mixing the heated carrier gas with at least a portion of a source gas that is a source for the compound semiconductor epitaxial layer, the source gas having a lower temperature than the heated carrier gas, and forming the compound semiconductor epitaxial layer on the substrate by supplying the mixed gas onto the substrate.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

The underlying knowledge forming the basis of the present disclosure will be described below.

To form a compound semiconductor epitaxial layer on a substrate, the substrate is placed in a reaction chamber of a CVD apparatus and a source gas is supplied together with a carrier gas into the reaction chamber. During this process, any distribution of the temperature of the source gas on the substrate disturbs the uniform decomposition of the source gas in the plane.

This phenomenon will be described taking a transverse CVD apparatus as an example. In the formation of an epitaxial layer with a transverse CVD apparatus, the source gas and the carrier gas are passed over the substrate in a horizontal direction and are discharged from the reaction chamber. In the specification, the direction in which the source gas and the carrier gas flow over the substrate is written as the "gas flow direction", and the temperature of a mixed gas including the carrier gas and the source gas is written as the "gas temperature". In the transverse CVD apparatus, the gas temperature above the substrate is lower on the upstream side in the gas flow direction than on the downstream side. This temperature distribution causes the state of the decomposition of the source gas to differ between the upstream and the downstream sides. Thus, in the absence of rotations of the substrate, the epitaxial growth of crystals takes place under different growth conditions between the upstream and the downstream sides of the substrate. As a result, distributions of properties such as thickness and impurity concentration can occur in the plane of the epitaxial layer. The use of such epitaxial layers may impair the performance of the obtainable semiconductor devices.

The "state of the decomposition of the source gas" indicates how much active species are generated by the decomposition of the source gas. In the case of SiC crystal growth, the "active species" are Si and $C_2H_2$ that contribute to the growth of SiC crystals. The epitaxial growth conditions include, for example, the effective C/Si ratio that is a ratio of the C-source active species to the Si-source active species.

Hereinbelow, the results of the studies carried out by the present inventor will be described in greater detail with reference to the drawings.

Figure 5:
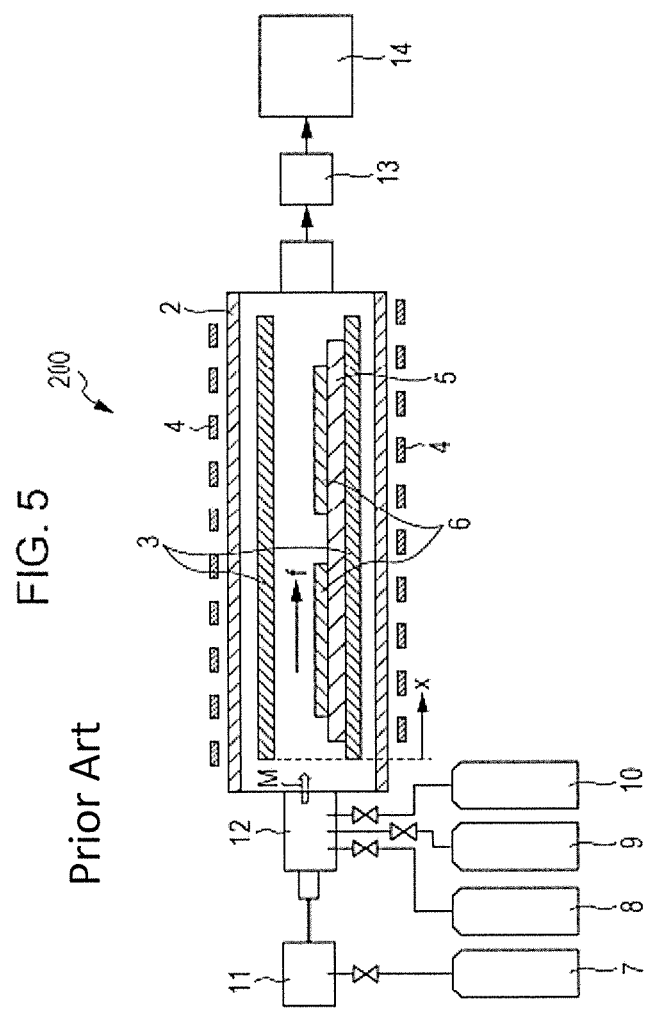
FIG. 5 is a schematic view illustrating a conventional CVD apparatus.

FIG. 5 is a schematic view illustrating an example of a conventional transverse CVD apparatus 200. The CVD apparatus 200 includes a reaction chamber 2 in which reaction is performed to epitaxially grow a compound semiconductor, a vacuum pump 13 that evacuates the reaction chamber 2, and a gas removal device 14 that removes a gas including reaction products. A mixed gas M including source gases and a carrier gas is supplied to the reaction chamber 2. In this example, silane ($SiH_4$) gas is used as a first source gas 8, propane ($C_3H_8$) gas is used as a second source gas 9, and nitrogen gas is used as a dopant gas 10. The first source gas 8, the second source gas 9, the dopant gas 10 and the carrier gas 7 are supplied from the respective tanks into the reaction chamber 2 through a gas mixing control system 12. The gas mixing control system 12 includes, for example, a mass flow controller that controls the flow rates of the gases. The carrier gas 7 is generally introduced into the gas mixing control system 12 after being cleaned of impurities in a carrier gas purifier 11.

In the inside of the reaction chamber 2, a cylindrical susceptor 3 serving as a heating element is disposed. A substrate holder 5 is disposed inside the susceptor 3. An induction coil 4 is arranged on the outside of the reaction chamber 2. Arrow f indicates the gas flow direction in the reaction chamber 2. In this example, the reaction chamber 2 is cylindrical and the susceptor 3 is arranged along the inner wall of the reaction chamber 2. The induction coil 4 is arranged along the outer peripheral surface of the reaction chamber 2. On the substrate holder 5, a substrate (a wafer) 6 is placed. The substrate holder 5 is, for example, a circle. On the substrate holder 5, a plurality of substrates 6 may be arranged radially while being spaced from one another. FIG. 5 illustrates two substrates 6 arranged along the gas flow direction f.

The application of high-frequency power to the induction coil 4 induces heating of the susceptor 3 which heats the susceptor 3, the substrate holder 5 and the substrates 6 to a prescribed temperature. The heat of the susceptor 3, the substrate holder 5 and the substrates 6 heats the carrier gas 7, the first source gas 8, the second source gas 9 and the dopant gas 10, causing the decomposition of the first and the second source gases 8 and 9. The products of the decomposition of the first and the second source gases 8 and 9 react together on the surface of the substrates 6, forming a compound semiconductor epitaxially grown from the surface of the substrates 6.

Although not shown, the CVD apparatus 200 further includes a mechanism that rotates the substrate holder 5 in a plane horizontal to the substrate holder 5. The mechanism can rotate the substrate holder 5 and the substrates 6 at a rotational speed of, for example, 60 rpm during the epitaxial growth.

The present inventor first studied the distributions of thickness and impurity concentration in the gas flow direction with respect to a SiC epitaxial layer formed on a SiC substrate mounted on the substrate holder 5 of the CVD apparatus 200. During the formation of the SiC epitaxial layer, the substrate holder 5 was not rotated. The first and the second source gases 8 and 9 were supplied to the reaction chamber 2 while controlling the flow rates so that the ratio of carbon to silicon in the source gases supplied (the C/Si feed ratio) would be 1.

Figure 6:
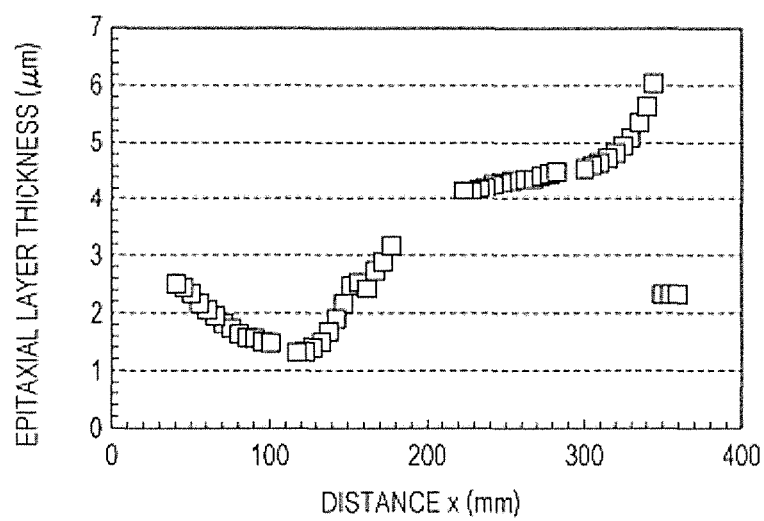
FIG. 6 is a diagram illustrating a distribution in the gas flow direction of the thickness of an epitaxial layer grown with the conventional CVD apparatus.
Figure 7:
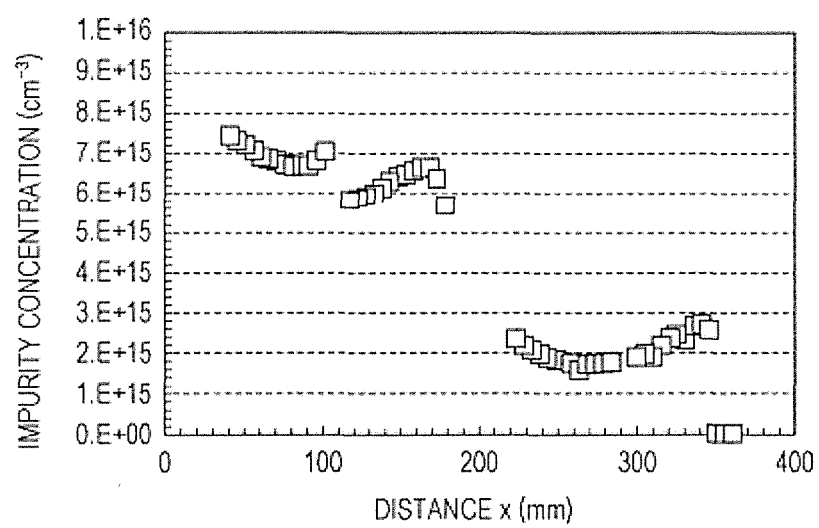
FIG. 7 is a diagram illustrating a distribution in the gas flow direction of the impurity concentration in an epitaxial layer grown with the conventional CVD apparatus.

FIG. 6 illustrates the results obtained in the measurement of the distribution of the thickness of the SiC epitaxial layer in the plane of the substrate. FIG. 7 illustrates the results obtained in the measurement of the distribution of the impurity concentration in the SiC epitaxial layer in the plane of the substrate. The abscissa in FIGS. 6 and 7 represents the distance x (mm) along the gas flow direction as measured from the most upstream end of the susceptor 3 in the gas flow direction.

The results given in FIGS. 6 and 7 show that the thickness and the impurity concentration of the SiC epitaxial layer have large distributions in the gas flow direction. The thickness of the SiC epitaxial layer broadly tends to be small on the upstream side in the gas flow direction and be increased with increasing distance toward the downstream side. That is, SiC is grown at a lower speed on the upstream side than on the downstream side in the gas flow direction. This result indicates that the source gases are not sufficiently decomposed on the upstream side in the gas flow direction and consequently the amounts of the active species contributing to the growth of the epitaxial layer are small.

Further, referring to FIG. 6, a significant decrease in the thickness of the SiC epitaxial layer is observed on the most downstream side in the gas flow direction. The reason for this sharp decrease is probably because the active species generated from the source gases are consumed in the growth of the SiC epitaxial layer and are finally exhausted by the time when the source gases reach the most downstream side along the gas flow direction.

On the other hand, referring to FIG. 7, the distribution of the carrier impurity concentration shows an approximately reverse tendency to the distribution of the thickness of the SiC epitaxial layer. Provided that the ratio of the dopant gas to the source gases is constant, epitaxial SiC crystals grown by a CVD method generally take in a larger amount of the dopant (impurity) with lower speed of the SiC growth and consequently the carrier impurity concentration in the SiC epitaxial layer is increased. At a higher speed of the SiC growth, a smaller amount of the impurity is incorporated into the CVD crystals and consequently the carrier impurity concentration is decreased. Thus, the distribution of the impurity concentration shown in FIG. 7 will depend on the thickness shown in FIG. 6, namely, the SiC growth speed. In FIG. 7, the impurity concentration is high on the upstream side in the gas flow direction, and this suggests that the dopant gas has been heated to such an extent that it is easily incorporated into the CVD crystals.

Regarding the rates of the changes in SiC growth speed and in dopant incorporation (impurity concentration), it is known that the impurity concentration is decreased at a low rate relative to the rate at which the growth speed is increased. However, referring to FIGS. 6 and 7, the change in impurity concentration is larger than the change in growth speed. Further, on the most upstream side in the gas flow direction, the impurity concentration is increased in synchrony with the increase in growth speed. That is, the relationship between the growth speed and the impurity concentration does not hold. In view of the fact that the impurity concentration can be changed by the effective C/Si ratio, the above result suggests that not only the growth speed but also the effective C/Si ratio in the source gases have distributions in the gas flow direction. For example, the site competition effect is known in which nitrogen as a dopant is incorporated in a larger amount with a decrease in the effective C/Si ratio.

In the specification, the ratio of carbon to silicon in the source gases supplied to the reaction chamber is written as the "C/Si feed ratio", and the ratio of carbon to silicon in the active species generated by the decomposition of the source gases in the reaction chamber is written as the "effective C/Si ratio". The effective C/Si ratio also takes into consideration the amounts of the active species used in the formation of the epitaxial layer.

In order to study the above phenomenon in greater detail, the present inventor measured the distribution of temperature above the substrate 6 in the reaction chamber 2. First, a substrate having a SiC epitaxial layer on its surface was provided and was set to the substrate holder 5. Next, without rotating the substrate holder 5, high-frequency power was applied to the induction coil 4 to increase the temperature in the reaction chamber 2. Subsequently, hydrogen gas as an etchant for the SiC epitaxial layer was passed through the reaction chamber 2 to perform etching of the SiC epitaxial layer. Thereafter, the distribution in the gas flow direction of the amount of etching of the SiC epitaxial layer, Δtx, was determined by comparing the thicknesses of the SiC epitaxial layer before and after the etching.

Before the above process, the relationship between the preset temperature of the susceptor 3 and the amount of etching of the SiC epitaxial layer had been determined by etching the crystals in the similar manner as above using the CVD apparatus 200 at various temperatures of the susceptor 3 while rotating the substrate holder 5. The amount of etching was substantially uniform in the plane. Hence, the relationship obtained may be regarded as representing the relationship between the gas temperature and the amount of etching.

With reference to the previously determined relationship between the preset temperature of the susceptor 3 and the amount of etching, the gas temperature was calculated based on the amount of etching of the SiC epitaxial layer, Δtx, thereby determining the distribution of gas temperature in the gas flow direction.

Figure 8:
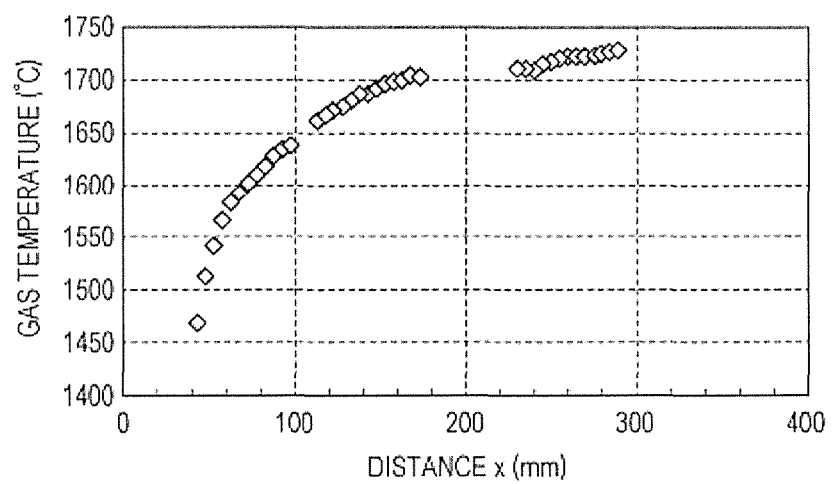
FIG. 8 is a diagram illustrating a distribution in the gas flow direction of the gas temperature in a reaction chamber of the conventional CVD apparatus.

FIG. 8 is a diagram illustrating the distribution of gas temperature in the gas flow direction calculated by the above method. The results given in FIG. 8 show that the gas temperature is low on the upstream side in the gas flow direction and is increased slowly with increasing distance toward the downstream side. The reason for the occurrence of such a distribution of gas temperature is probably because the gas introduced into the reaction chamber 2 at room temperature is gradually heated by the susceptor 3 and the substrate holder 5 during the travel in the reaction chamber 2. Under usual CVD conditions, the flow rate of the carrier gas 7 is set to about 100 L/min, whilst the flow rates of the first and the second source gases 8 and 9 are each about several tens of cc per minute (cc/min). Thus, it is probable that the gas temperature is mainly dependent on the temperature of the carrier gas 7.

Figure 9:
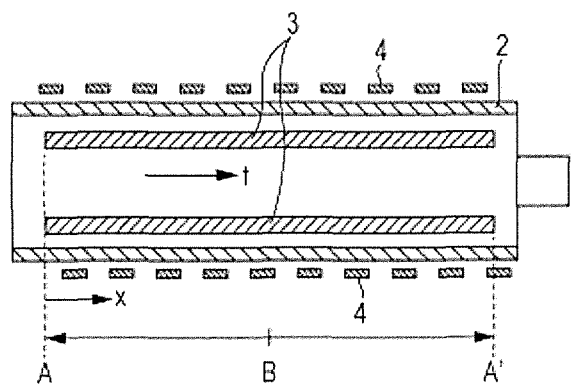
FIG. 9 is an enlarged view of a reaction chamber of the conventional CVD apparatus used in a simulation of a temperature distribution in the reaction chamber and the distributions of the Si and $C_2H_2$ concentrations.

Next, a simulation was made to study the distribution of the state of the decomposition of the source gases ascribed to the distribution of gas temperature given in FIG. 8. FIG. 9 is a sectional view of the reaction chamber 2 used in the simulation. In the reaction chamber 2 containing the susceptor 3 alone, the simulation calculated the concentrations of the active species present in the source gases between the most upstream end A and the most downstream end A' of the susceptor 3 in the gas flow direction f. The simulation took into consideration not only the amounts of the decomposition of the source gases but also the amounts of the active species consumed in the deposition of SiC onto the substrate 6 and the substrate holder 5.

The simulation showed that silane gas was gradually decomposed while being passed in the gas flow direction, forming the active species Si that contributes to epitaxial growth. Similarly, propane gas was shown to be gradually decomposed into the active species $C_2H_2$ during the travel in the gas flow direction. The concentrations of the decomposition products Si and $C_2H_2$ were both highest near the midpoint B of the susceptor 3 in the gas flow direction.

Figure 10:
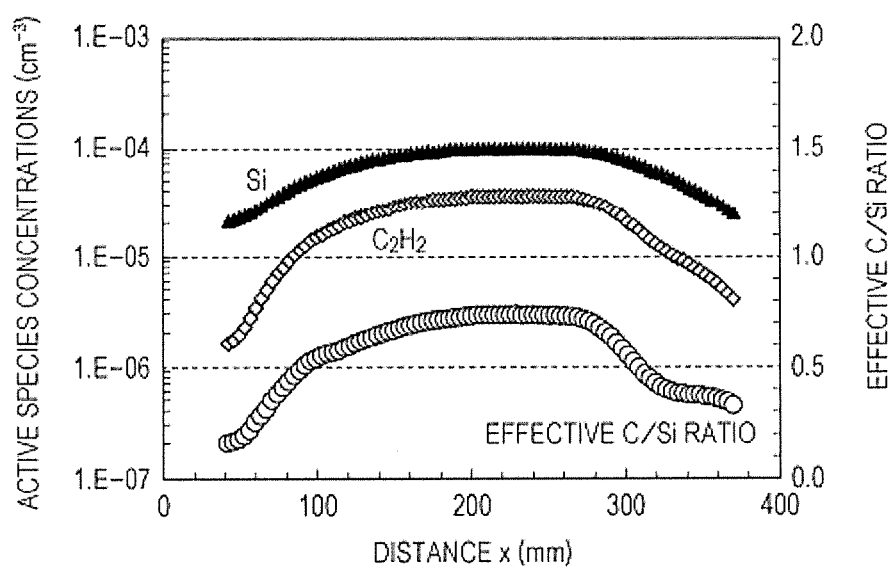
FIG. 10 is a diagram illustrating distributions in the gas flow direction of the concentrations of Si and $C_2H_2$ generated by the decomposition of source gases, and of the effective C/Si ratio in the reaction chamber of the conventional CVD apparatus.

The simulation results are illustrated in FIG. 10. FIG. 10 is a diagram illustrating the distributions of the concentrations of the active species Si and $C_2H_2$, and of the effective C/Si ratio calculated from the active species concentrations. The abscissa in FIG. 10 indicates the distance x along the gas flow direction f from the upstream end A of the susceptor 3.

As illustrated in FIG. 10, the variation in the distance x along the gas flow direction f caused the effective C/Si ratio to change from 0.16 at the minimum to 0.74 at the maximum, with as large a difference as of 0.58. Detailed analysis of the distribution of the effective C/Si ratio shows that the effective C/Si ratio is low on the upstream side because the Si concentration on the upstream side far surpasses the $C_2H_2$ concentration due to the different decomposition rates of silane and propane. Further, as described earlier, the growth speed is low on the upstream side in the gas flow direction f because the concentrations of the active species as the sources are low.

From the above discussion, referring to FIGS. 6 and 7, the reason why the impurity concentration in the SiC epitaxial layer on the upstream side was above the level expected based on the thickness (the growth speed) of the SiC epitaxial layer and also based on the change in thickness toward the downstream side is probably because not only the growth speed but also the effective C/Si ratio were low on the upstream side and consequently a significantly increased amount of the impurity was incorporated into the epitaxial layer.

On the other hand, the concentrations of both active species were rapidly decreased on the downstream side. The reason for this is probably because the active species generated by decomposition in the reaction chamber 2 were exhausted by the consumption in the crystal growth on the substrate and the substrate holder 5. This reasoning agrees with the marked decrease in the thickness of the SiC epitaxial layer on the most downstream side as illustrated in FIG. 6.

Figure 11:
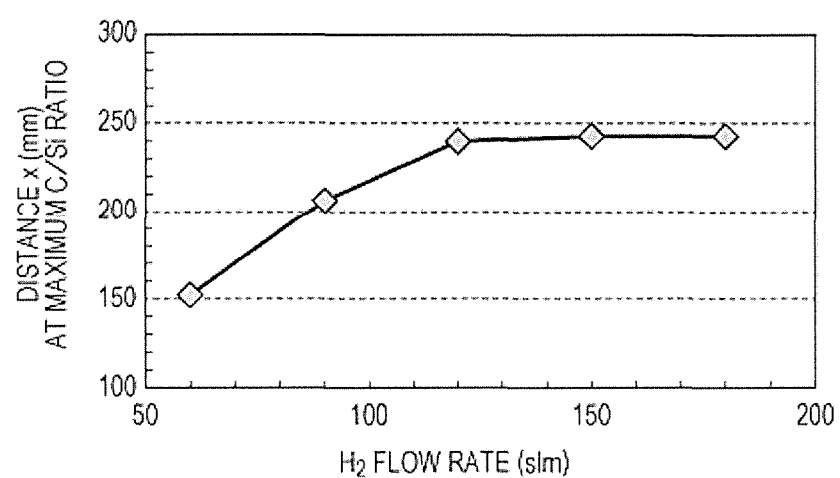
FIG. 11 is a diagram illustrating the distance x along the gas flow direction from the upstream end of a susceptor in the conventional CVD apparatus at which the effective C/Si ratio reaches the maximum, plotted against the flow rate of a carrier gas.

FIG. 11 is a diagram illustrating the distance x at which the effective C/Si ratio reaches the maximum, plotted against the flow rate of hydrogen as the carrier gas. As illustrated in FIG. 11, the distance x at the maximum effective C/Si ratio shifts to the downstream side with increasing flow rate of hydrogen gas. The hydrogen gas flowing at a higher rate is more difficult to heat and hence requires a longer time until the hydrogen gas introduced into the reaction chamber 2 at room temperature reaches a temperature effectively inducing the decomposition of the source gases. In other words, the distance x by which the hydrogen gas flows in the gas flow direction f is increased. This adds an explanation to the discussion described hereinabove, for example, the higher gas temperature on the downstream side.

For example, a possible approach to form a uniform SiC epitaxial layer by reducing the distribution of gas temperature is to increase the lengths of the reaction chamber 2, the susceptor 3 and the induction coil 4 along the gas flow direction and to arrange the substrate holder 5 and the substrate 6 on a more downstream position than conventional. This approach prevents the crystal growth from occurring in the region in which the gas temperature and the effective C/Si ratio are low.

However, studies of the present inventor have shown that the above method comes with the following problems. According to the above method, portions of the first and the second source gases 8 and 9 introduced into the reaction chamber 2 reach the prescribed temperature and react to each other before they arrive at the substrate 6. This consumption of the first and the second source gases 8 and 9 before the arrival at the substrate 6 makes it difficult to achieve an effective growth speed. In the case where the substrate 6 has an increased diameter, the source gases become markedly exhausted by the time when the gases reach the downstream portion of the substrate 6 and consequently fail to form a SiC epitaxial layer having high uniformity. Further, the above approach gives rise to a risk that SiC is grown on regions upstream from the substrate 6 such as on the wall of the susceptor 3. The exfoliation of SiC grown on such regions as the wall of the susceptor 3 produces particles which may serve to decrease the yield.

Based on the knowledge obtained from the results of the studies discussed above, the present inventor has developed a method which can form an epitaxial layer while reducing the distribution of gas temperature above a substrate, and a novel CVD apparatus for use in the method. The techniques disclosed in the specification have been thus realized.

A summary of the present disclosure is as follows.

An aspect of the present disclosure resides in a method for manufacturing a compound semiconductor epitaxial substrate including a substrate and a compound semiconductor epitaxial layer disposed on the substrate, the method including providing the substrate, heating a carrier gas, preparing a mixed gas by mixing the heated carrier gas with at least a portion of a source gas that is a source for the compound semiconductor epitaxial layer, the source gas having a lower temperature than the heated carrier gas, and forming the compound semiconductor epitaxial layer on the substrate by supplying the mixed gas onto the substrate.

By the above manufacturing method according to an aspect of the present disclosure, it is possible to produce a compound semiconductor epitaxial substrate which includes a compound semiconductor epitaxial layer with an enhanced uniformity in properties such as thickness and impurity doping density in the plane of the epitaxial layer.

In the method for manufacturing a compound semiconductor epitaxial substrate, at least a portion of the mixed gas is decomposed during the production of the mixed gas by the mixing of the heated carrier gas with the source gas.

In the specification, the phrase "uniform in the plane of the substrate" or "uniform in the plane" means that the compound semiconductor epitaxial layer formed on the surface of the substrate has uniformity in a plane parallel to the surface of the substrate.

In the method for manufacturing a compound semiconductor epitaxial substrate, an angle formed between a surface of the substrate and a direction in which the mixed gas is supplied to the substrate may be 0° to 10°. That is, the mixed gas may be supplied onto the substrate in a direction substantially in parallel to the surface of the substrate.

In the method for manufacturing a compound semiconductor epitaxial substrate, the carrier gas may be heated to a temperature of 1600° C. to 1750° C.

The method for manufacturing a compound semiconductor epitaxial substrate may further include supplying another portion of the source gas onto the substrate without mixing the portion with the carrier gas.

The method for manufacturing a compound semiconductor epitaxial substrate may further include adding a dopant gas to the carrier gas before the heating of the carrier gas. In the method, the heating the carrier gas may include heating the carrier gas together with the dopant gas.

In the method for manufacturing a compound semiconductor epitaxial substrate, the carrier gas may be hydrogen gas.

For example, the substrate is a silicon carbide substrate and the compound semiconductor epitaxial layer is a silicon carbide epitaxial layer.

Another aspect of the present disclosure resides in a CVD apparatus for forming a compound semiconductor epitaxial layer on a surface of a substrate, the CVD apparatus including a reaction chamber having a substrate holder which holds the substrate during operation; a source gas inlet through which a source gas as a source for the compound semiconductor epitaxial layer is introduced into the CVD apparatus; a carrier gas inlet through which a carrier gas is introduced into the CVD apparatus; a carrier gas heating chamber which is disposed between the carrier gas inlet and the reaction chamber and in which the carrier gas is heated; a gas mixing chamber which is disposed between the carrier gas heating chamber and the reaction chamber and in which the source gas introduced through the source gas inlet and the carrier gas heated in the carrier gas heating chamber are mixed with each other to form a mixed gas; a mixed gas inlet which is disposed in a section of the reaction chamber and through which the mixed gas is introduced into the reaction chamber; and a discharge outlet which is disposed in a section of the reaction chamber at a position opposite to the mixed gas inlet with the substrate holder therebetween and through which the mixed gas is discharged from the reaction chamber.

The CVD apparatus according to an aspect of the present disclosure can form a compound semiconductor epitaxial layer having an enhanced uniformity in properties such as thickness and impurity doping density in the plane of the epitaxial layer.

The CVD apparatus may further include at least one additional source gas inlet through which a portion of the source gas is introduced directly into the reaction chamber during operation.

For example, the at least one additional source gas inlet may include a first additional source gas inlet and a second additional source gas inlet, and the respective flow rates of the source gas introduced into the reaction chamber through the first additional source gas inlet and the second additional source gas inlet may be controlled separately.

The CVD apparatus may further include a dopant gas inlet which is disposed upstream from the carrier gas heating chamber and through which a dopant gas is added to the carrier gas during operation.

For example, the substrate is a silicon carbide substrate and the compound semiconductor epitaxial layer is a silicon carbide epitaxial layer.

Hereinbelow, apparatuses which may be used in the formation of epitaxial layers representing some embodiments of the present disclosure will be described in greater detail with reference to the drawings. It should be noted that the apparatuses used in the embodiments are not limited to those illustrated in the drawings, and the drawings are only illustrative for the purpose of helping the understanding of some embodiments of the present disclosure.

First Embodiment

Hereinbelow, a CVD apparatus 100 in the first embodiment of the present disclosure will be described with reference to the drawings.

Figure 1:
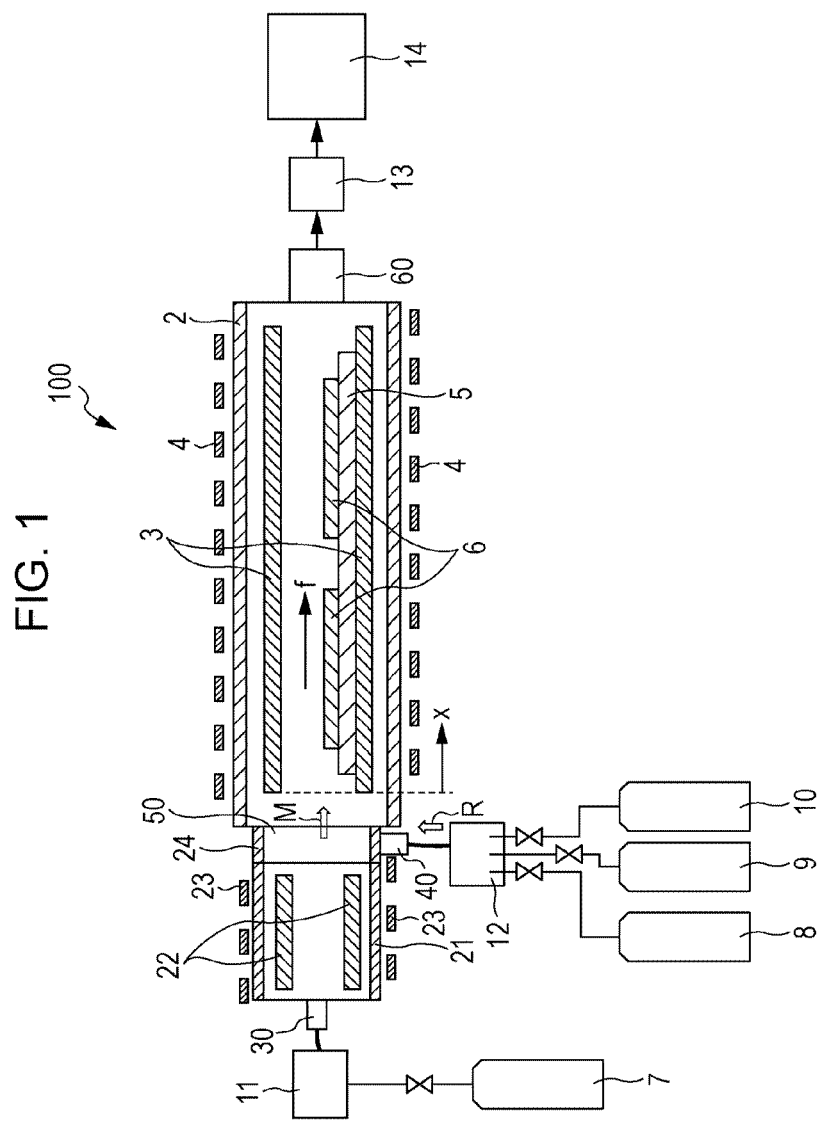
FIG. 1 is a schematic view illustrating a CVD apparatus according to a first embodiment.

FIG. 1 is a schematic view illustrating a transverse CVD apparatus 100 which may be used in the present embodiment. The CVD apparatus 100 is designed to form a compound semiconductor epitaxial layer on a surface of a substrate. The substrate may be a compound semiconductor wafer. The compound semiconductors are not particularly limited and may be wide bandgap semiconductors such as SiC, gallium nitride (GaN) and aluminum nitride (AlN).

The CVD apparatus 100 includes a reaction chamber 2 having a substrate holder 5, and also includes a source gas inlet 40, a carrier gas inlet 30, a carrier gas heating chamber 21, a gas mixing chamber 24, a mixed gas inlet 50 and a discharge outlet 60. A compound semiconductor epitaxial layer may be formed on a substrate in the reaction chamber 2 by introducing, for example, first and second source gases 8 and 9 as sources for the compound semiconductor, and a dopant gas 10 into the reaction chamber 2 of the CVD apparatus 100. Hereinbelow, the elements constituting the CVD apparatus 100 will be described in more detail.

The reaction chamber 2 includes the substrate holder 5. The substrate holder 5 can hold a substrate 6 in a horizontal condition. The reaction chamber 2 may include a heating unit that heats the substrate holder 5 and the substrate 6 in the reaction chamber 2. For example, the heating unit includes a first susceptor 3 disposed inside the reaction chamber 2, and a first induction coil 4 arranged along the outer peripheral surface of the reaction chamber 2. The configurations and the actions of the first susceptor 3 and the first induction coil 4 may be similar to those of the susceptor 3 and the induction coil 4 described hereinabove with reference to FIG. 5.

The source gas inlet 40 serves to allow the first and the second source gases 8 and 9 as the sources for the compound semiconductor epitaxial layer to be introduced into the CVD apparatus 100. The source gas inlet 40 may serve as an inlet port for the first and the second source gases 8 and 9 alone, or for a gas including the first and the second source gases 8 and 9, and the dopant gas 10. In this example, the first and the second source gases 8 and 9, and the dopant gas 10 are mixed in a prescribed ratio in a gas mixing control system 12, and the mixture is introduced into the CVD apparatus 100 through the source gas inlet 40. For example, the gas mixing control system 12 includes a mass flow controller that controls the flow rates of the gases. In the specification, the gas including the first and the second source gases 8 and 9 that is introduced through the source gas inlet 40 is also written as the "source-containing gas R".

The carrier gas inlet 30 serves to allow a carrier gas 7 to be introduced into the CVD apparatus 100. The carrier gas 7 may be introduced into the CVD apparatus 100 through the carrier gas inlet 30 after being cleaned of impurities in a carrier gas purifier 11.

The carrier gas heating chamber 21 is disposed between the carrier gas inlet 30 and the reaction chamber 2. In this example, the carrier gas heating chamber 21 is located downstream from the carrier gas inlet 30 and upstream from the reaction chamber 2 in the direction in which the carrier gas is passed. In the specification, the phrase "between the carrier gas inlet 30 and the reaction chamber 2" means that the location is between these elements in the direction of the flow of the carrier gas. Any location expressed with a similar phrase is to be understood to be found between elements in the direction of the flow of any gas to be introduced into such elements.

In the carrier gas heating chamber 21, the carrier gas 7 to be introduced into the reaction chamber 2 is heated. For example, the carrier gas heating chamber 21 may include a heating unit that heats the carrier gas 7 in the carrier gas heating chamber 21. For example, the heating unit may include a second susceptor 22 disposed inside the carrier gas heating chamber 21, and a second induction coil 23 arranged along the outer peripheral surface of the carrier gas heating chamber 21. The application of high-frequency power to the second induction coil 23 generates induction heat and thereby can heat the second susceptor 22 and the carrier gas 7 in the carrier gas heating chamber 21 to a prescribed temperature. The second susceptor 22 may be a cylinder arranged along the inner wall of the cylindrical carrier gas heating chamber 21. The second induction coil 23 may be arranged along the outer peripheral surface of the carrier gas heating chamber 21.

The gas mixing chamber 24 is disposed between the carrier gas heating chamber 21 and the reaction chamber 2. In the gas mixing chamber 24, the carrier gas 7 heated in the carrier gas heating chamber 21 and the source-containing gas R introduced through the source gas inlet 40 are mixed with each other to give a mixed gas M.

The mixed gas inlet 50 is disposed in a section of the reaction chamber 2. The mixed gas M formed in the gas mixing chamber 24 is introduced into the reaction chamber 2 through the mixed gas inlet 50.

The discharge outlet 60 is disposed in a section of the reaction chamber 2. The mixed gas M passed in the reaction chamber 2 is discharged out of the reaction chamber 2 through the discharge outlet 60. In the reaction chamber 2, the discharge outlet 60 is disposed at a position opposite to the mixed gas inlet 50 with the substrate holder 5 therebetween.

The discharge outlet 60 may be connected to a vacuum pump 13 that evacuates the reaction chamber 2. The gas discharged through the discharge outlet 60 may be introduced into a gas removal device 14 that removes the gas including reaction products.

In the CVD apparatus 100, the carrier gas 7 that has been heated beforehand is mixed with the first and the second source gases 8 and 9 that are supplied at, for example, room temperature in the gas mixing chamber 24. In this manner, the first and the second source gases 8 and 9 are heated. Because the carrier gas 7 represents the major proportion of the mixed gas M to be introduced into the reaction chamber 2, mixing the carrier gas 7 with the first and the second source gases 8 and 9 can quickly raise the temperature of the first and the second source gases 8 and 9 to approximately the same temperature as the carrier gas 7. Thus, the first and the second source gases 8 and 9 may have a sufficiently increased temperature at entry into the reaction chamber 2. It is hence possible to increase the gas temperature on the upstream side in the reaction chamber 2 as compared to the conventional level, and to reduce the distribution of gas temperature in the gas flow direction. As a result, the decomposition of the first and the second source gases 8 and 9 is allowed to take place even on the upstream side of the reaction chamber 2 to ensure a sufficient speed of the growth of an epitaxial layer. Thus, it becomes possible to form a compound semiconductor epitaxial layer with an enhanced uniformity in properties such as thickness and impurity concentration in the plane of the epitaxial layer.

In the CVD apparatus 100, only the carrier gas 7 is heated before the mixing. Preheating of the first and the second source gases 8 and 9 gives rise to a risk that the active species produced by their thermal decomposition react with each other before they arrive at the substrate 6 and are consumed in the deposition of crystals onto surfaces such as the inner wall of the CVD apparatus 100. In the present embodiment, only the carrier gas 7 is heated beforehand, and the first and the second source gases 8 and 9 are rapidly heated by being mixed with the heated carrier gas 7 in the gas mixing chamber 24. In this manner, it is possible to reduce the amounts of the active species consumed before arrival at the substrate 6. The amounts of the active species consumed before arrival at the substrate 6 may be reduced more effectively by arranging the gas mixing chamber 24 immediately close to the reaction chamber 2, specifically, by arranging the gas mixing chamber 24 adjacent to the reaction chamber 2 through the mixed gas inlet 50. Sufficient heating of the source-containing gas R is feasible also by reducing the size of the gas mixing chamber 24. Thus, the amounts of the active species consumed before arrival at the substrate 6 may be reduced still more effectively by reducing the size of the gas mixing chamber 24. For example, the width of the gas mixing chamber 24 in the direction of the flow of the carrier gas may be reduced to less than half the width of the carrier gas heating chamber 21 in the direction of the flow of the carrier gas.

As described above, the use of the CVD apparatus 100 makes it possible to grow a compound semiconductor epitaxial layer on the substrate 6 at a prescribed growth speed with high efficiency. Further, the CVD apparatus 100 can prevent the exhaustion of the active species generated from the source-containing gas R on the downstream side, and thus makes it possible to enhance the uniformity in the thickness of the compound semiconductor epitaxial layer more effectively. Further, it is possible to prevent the decrease in yield due to the exfoliation of compound semiconductors grown on surfaces such as walls upstream from the substrate 6.

According to the present embodiment, an epitaxial layer may be formed with enhanced uniformity without the need of rotating the substrate. The consequent elimination of a substrate rotating mechanism leads to the simplification of the configuration of the CVD apparatus 100, and also saves the costs of the CVD apparatus 100 such as initial cost, operation cost and maintenance cost. As a result, the total costs associated with the formation of epitaxial layers may be reduced. Incidentally, the CVD apparatus 100 may include a substrate rotating mechanism. The uniformity in an epitaxial layer may be enhanced more effectively by forming the epitaxial layer with the CVD apparatus 100 while rotating the substrate.

In the conventional methods, the gas temperature has a distribution in the gas flow direction and consequently good in-plane uniformity may not be obtained at times even when an epitaxial layer is formed while rotating the substrate. For example, a certain arrangement of the substrate holder and the substrate can cause one end of the substrate to rotate only near the center of the reaction chamber and another end to rotate in a larger circle near the wall of the reaction chamber, resulting in the occurrence of distributions of growth speed and impurity concentration in the plane of the substrate. According to this embodiment of the present disclosure, in contrast, the distribution of gas temperature in the gas flow direction f may be reduced to ensure more reliably that the obtainable epitaxial layer achieves high in-plane uniformity. While good in-plane uniformity may be obtained in this embodiment of the present disclosure even without the rotation of the substrate, the in-plane uniformity may be enhanced still more effectively by forming the epitaxial layer while rotating the substrate. The substrate 6 may be rotated so as to pass through both the upstream side and the downstream side in the gas flow direction by the rotation of the substrate holder 5.

For example, the CVD apparatus 100 may be applied to the manufacturing of compound semiconductor epitaxial substrates. The compound semiconductor epitaxial substrates have compound semiconductor epitaxial layers on the surface of compound semiconductor substrates. In the specification, such substrates are abbreviated to the "epitaxial substrates". Further, the CVD apparatus 100 may be used in the manufacturing of various semiconductor devices involving the epitaxial substrates.

Next, an example of the methods for forming compound semiconductor epitaxial layers with the CVD apparatus 100 will be described. As an example, the method described below illustrates the formation of a SiC epitaxial layer on a SiC substrate as the substrate 6.

First, the substrate 6 is set to the substrate holder 5 of the CVD apparatus 100 and is held in a horizontal condition in the reaction chamber 2. The substrate 6 may be a SiC substrate having an off angle, for example, a 4H—SiC substrate of first conductivity type (n-type) (diameter: 150 mm) having an off angle θ of 4° relative to the (0001) plane. For example, the off direction is the <11-20> direction.

Next, the carrier gas 7 is introduced into the carrier gas heating chamber 21 through the carrier gas inlet 30 and is heated to a prescribed temperature in the carrier gas heating chamber 21. For example, the carrier gas 7 is hydrogen gas. For example, the carrier gas 7 may be heated to a temperature approximately equal to the temperature at which the reaction of the source gases will be performed. In this case, the second susceptor 22 in the carrier gas heating chamber 21 may be set to the same temperature as the first susceptor 3 in the reaction chamber 2. The preset temperature is not particularly limited and is, for example, 1600 to 1750° C. The preset temperature for the second susceptor 22 may be different from the preset temperature for the first susceptor 3, that is, may be higher or lower than the preset temperature for the first susceptor 3. The desired effects may be obtained as long as the preset temperature for the second susceptor 22 is higher than the temperature of the carrier gas 7 that is supplied (for example, room temperature).

Next, the heated carrier gas 7 and the source-containing gas R including the first and the second source gases 8 and 9 are introduced into the gas mixing chamber 24 and are mixed with each other to form a mixed gas M. For example, the source-containing gas R includes a silicon gas such as silane ($SiH_4$) gas as the first source gas 8, a carbon gas such as propane ($C_3H_8$) gas as the second source gas 9, and an n-type impurity gas such as nitrogen gas as the dopant gas 10. These gases may be introduced into the gas mixing chamber 24 through the source gas inlet 40 via the gas mixing control system 12. The gas mixing control system 12 controls the flow rates of the respective gases so that the gases will be mixed in a prescribed ratio. The flow rates of the silane gas and the propane gas are not particularly limited. For example, the flow rate of the silane gas diluted to 10% with hydrogen may be set at 50 sccm to 450 sccm. The flow rate of the propane gas may be varied in accordance with the flow rate of the silane gas. For example, the flow rates of these gases may be set so that the ratio of the number of carbon atoms to the number of silicon atoms in the gases supplied (the C/Si feed ratio) will be 1. For example, the flow rate of the dopant gas may be set so that the impurity concentration in the SiC epitaxial layer will be $3.0 \times 10^{15}$ to $1.0 \times 10^{16}$ cm$^{-3}$. The kinds and the proportions of the source gases are variable depending on the kinds of the compound semiconductor epitaxial layers to be formed. Further, p-type epitaxial layers may be formed using a p-type impurity gas as the dopant gas 10.

Subsequently, the mixed gas M formed in the gas mixing chamber 24 is introduced into the reaction chamber 2 through the mixed gas inlet 50. The mixed gas M is supplied onto the substrate 6 along a direction parallel to the surface of the substrate 6, thereby forming an n-type SiC epitaxial layer on the substrate 6. The mixed gas M flows in the reaction chamber 2 from the mixed gas inlet 50 toward the discharge outlet 60, and is discharged through the discharge outlet 60.

In the present embodiment, the source gases 8 and 9 are mixed with the carrier gas 7 having a higher temperature than the source gases 8 and 9, and the resultant mixed gas M is supplied to the reaction chamber. In this manner, the gas temperature on the upstream side of the reaction chamber 2 may be increased. Thus, the difference in gas temperature between on the upstream side and on the downstream side of the substrate may be reduced, and consequently the distribution of the effective C/Si ratio on the substrate may be reduced. As a result, the gases may be decomposed more uniformly on the upstream and downstream sides. Because the epitaxial crystals are grown under substantially similar conditions on the upstream side and on the downstream side of the substrate, it is possible to reduce the variations in the thickness and the impurity concentration of the epitaxial layer between on the upstream side and on the downstream side of the substrate. Further, the feasibility of rapid heating of the source gases immediately before entry into the reaction chamber 2 makes it possible to prevent the source gases from being decomposed and consumed before arriving at the substrate 6.

A simulation was made to study the distributions of the active species concentrations and the effective C/Si ratio in the plane of a SiC epitaxial layer formed on a SiC substrate with the CVD apparatus 100. The simulation method and the results are described below.

The simulation assumed that hydrogen gas as the carrier gas was preheated in the carrier gas heating chamber 21 of the CVD apparatus 100 so that its temperature became equal to the gas temperature at a distance x of 100 mm in the reaction chamber of the conventional CVD apparatus 200 illustrated in FIG. 8. The gas temperature in the reaction chamber of the CVD apparatus 100 was assumed to be such that the temperature at a distance x of 0 was equal to the gas temperature (1638° C.) at a distance x of 100 mm in the reaction chamber of the conventional CVD apparatus 200, and such that the temperature reached the maximum (1727° C.) at a distance x of 290 mm similarly to that in the conventional CVD apparatus 200. Further, the gas temperature in the reaction chamber of the CVD apparatus 100 was assumed to increase at the same rate between distances x of 0 mm and 290 mm as the gas temperature in the reaction chamber of the conventional CVD apparatus 200. Under the conditions described above, the distribution of gas temperature in the reaction chamber of the CVD apparatus 100 was simulated.

Figure 13:
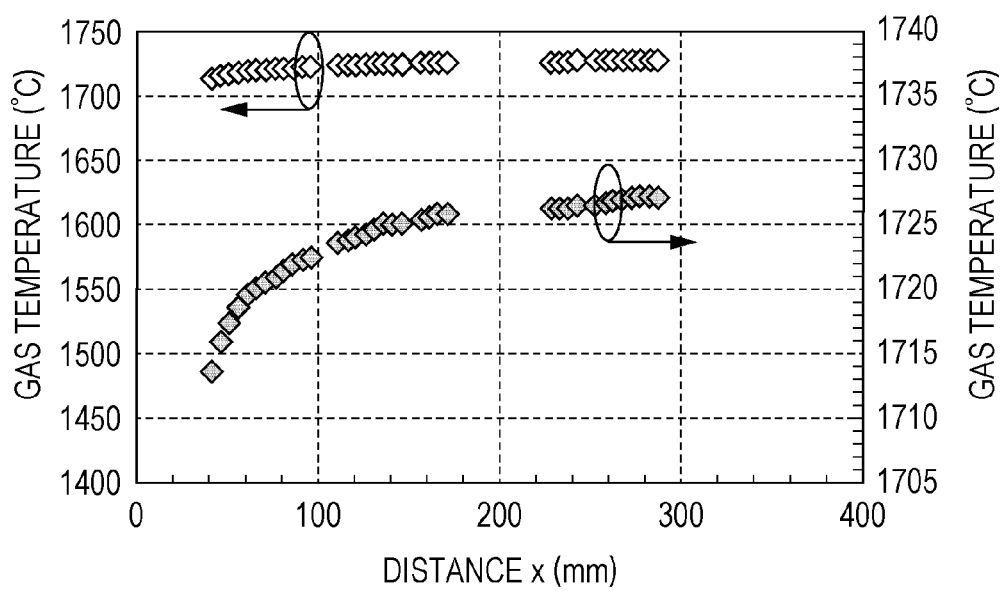
FIG. 13 is a diagram illustrating a distribution in the gas flow direction of the gas temperature in the reaction chamber of the CVD apparatus.

FIG. 13 is a diagram illustrating the distribution in the gas flow direction f of the temperature of the carrier gas in the CVD apparatus 100 according to the calculation by the above method. The abscissa represents the distance x along the gas flow direction as measured from the upstream end of the first susceptor 3. The left ordinate plots the results in the same range as in FIG. 8, and the right ordinate plots the results in an enlarged range. The results show that in the present embodiment, the gas temperature on the upstream side is higher and the distribution of carrier gas temperature is more uniform than in the distribution of gas temperature in the case of the conventional CVD apparatus 200 (FIG. 8). Thus, it has been confirmed that the distribution of gas temperature in the gas flow direction f may be enhanced by the preheating of the carrier gas.

Next, distributions of the concentrations of the active species Si and $C_2H_2$ generated by the decomposition of the silane gas and the propane gas were obtained by simulation based on the distribution of carrier gas temperature obtained above. As already mentioned hereinabove with reference to FIG. 9, the simulation took into consideration not only the decomposition of the source gases but also the consumption of the active species in the deposition of SiC onto the compound semiconductor substrate and the substrate holder.

Figure 2:
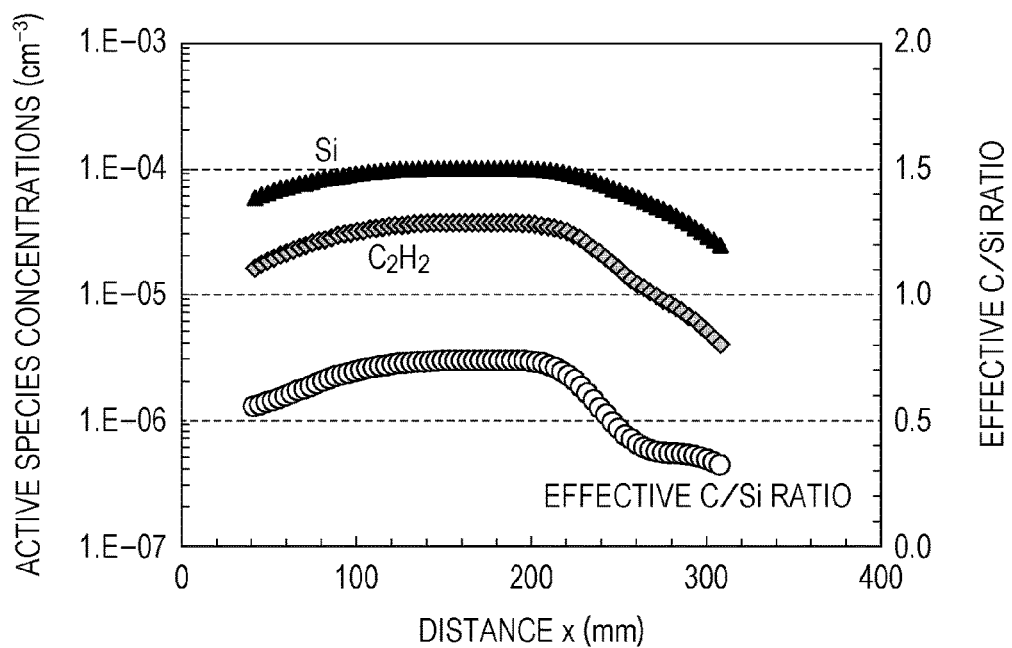
FIG. 2 is a diagram illustrating distributions in the gas flow direction of the concentrations of Si and $C_2H_2$ generated by the decomposition of source gases, and of the effective C/Si ratio in a reaction chamber of the CVD apparatus.

The simulation results are shown in FIG. 2, which illustrates the distributions of the concentrations of the active species Si and $C_2H_2$, and of the effective C/Si ratio calculated based on the active species concentrations.

In the present embodiment, as illustrated in FIG. 2, the effective C/Si ratio, although showing a significant decrease on the downstream side, has a small distribution in the region from the upstream side to the midpoint B of the first susceptor 3 in the gas flow direction f as compared to the distribution of the effective C/Si ratio in the case of using the conventional CVD apparatus 200 (FIG. 10). In the example using the conventional CVD apparatus 200, the difference in the effective C/Si ratio in the region from the upstream side to the midpoint B of the susceptor 3 in the gas flow direction f is 0.58. (This region will be written as the upstream region.) In the present embodiment, in contrast, the effective C/Si ratio in the upstream region is 0.56 at minimum and 0.76 at maximum, with the difference being 0.20. Thus, the distribution of the effective C/Si ratio is markedly enhanced as compared to the conventional level.

In the present embodiment, as discussed above, an enhancement may be obtained in the uniformity of the distribution of the effective C/Si ratio on the SiC substrate in the upstream region in the first susceptor 3, resulting in an enhancement in the uniformities of the thickness and the impurity concentration of the epitaxial layer formed on the substrate. Accordingly, the advantageous effects of the present disclosure are particularly remarkable when the substrate 6 is set in the upstream region.

Second Embodiment

Hereinbelow, an example of a CVD apparatus 101 in the second embodiment of the present disclosure will be described with reference to the drawings.

Figure 3:
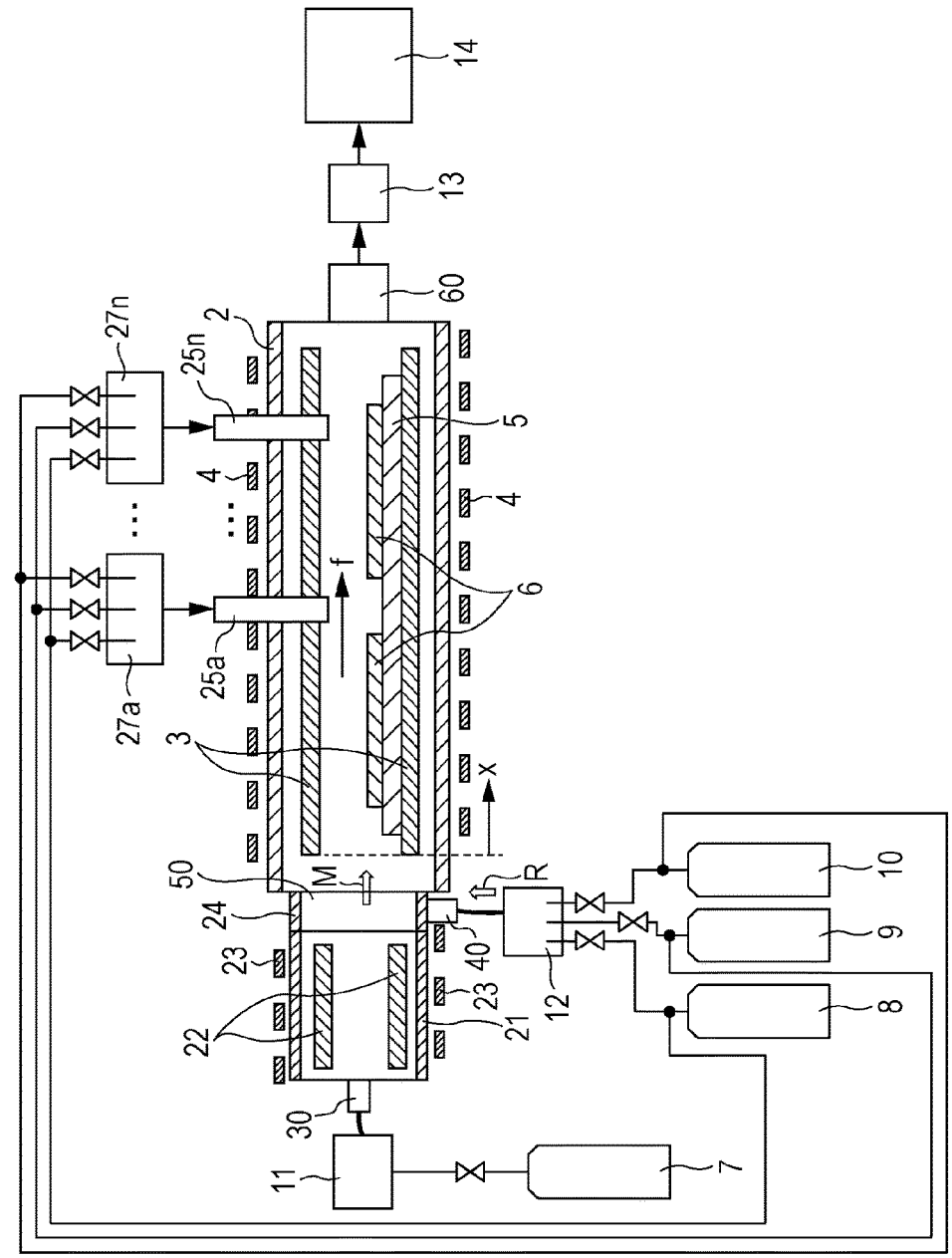
FIG. 3 is a schematic view illustrating a CVD apparatus according to a second embodiment.

FIG. 3 is a schematic view illustrating a transverse CVD apparatus 101 which may be used in the present embodiment. The CVD apparatus 101 differs from the CVD apparatus 100 in the first embodiment described with reference to FIG. 1 in that the CVD apparatus 101 includes at least one additional source gas inlet 25 through which, during operation, a portion of the source-containing gas R is introduced directly into the reaction chamber 2.

In the reaction chamber 2, the additional source gas inlet is disposed, for example, downstream from the mixed gas inlet 50. With this configuration, additional amounts of the source gases may be supplied to the course of the gas flow in the reaction chamber 2. A plurality of additional source gas inlets may be provided. For example, a first additional source gas inlet and a second additional source gas inlet may be disposed in the reaction chamber 2. The second additional source gas inlet may be disposed downstream from the first additional source gas inlet. The additional source gas inlets serve as inlet ports for at least the source gases and may serve as inlet ports for, for example, the source-containing gas including the source gases and the dopant gas 10.

The respective flow rates of the source gases introduced into the reaction chamber 2 through the first additional source gas inlet and through the second additional source gas inlet may be controlled separately. For example, the source gases may be supplied through the first additional source gas inlet and through the second additional source gas inlet via a first additional gas mixing control system and via a second additional gas mixing control system, respectively. For example, the additional gas mixing control systems include a mass flow controller that controls the flow rates of the gases.

The flow rates of the first and the second source gases 8 and 9 introduced to each of the additional source gas inlets may be controlled appropriately so that the distribution of the effective C/Si ratio will be reduced. In the case where silane gas as the first source gas 8 and propane gas as the second source gas 9 are introduced through the plurality of additional source gas inlets, the flow rates may be designed so that, for example, propane is introduced in a larger amount on the downstream side and silane is introduced in a larger amount on the upstream side. In this manner, the decrease in the effective C/Si ratio on the downstream side may be compensated for.

The CVD apparatus 101 illustrated in FIG. 3 has as many additional source gas inlets as indicated by the letter n, namely, the first additional source gas inlet 25a to the n-th (n is an integer) additional source gas inlet 25n.

Providing the additional source gas inlets makes it possible to compensate for the consumption of the source gases by the growth of the compound semiconductor in the inside of the reaction chamber 2 such as on the substrate 6. Consequently, the active species from the source gases may be prevented from being exhausted in the course of the gas flow.

The CVD apparatus 101 may further include a first additional gas mixing control system 27a that supplies the source gases to the first additional source gas inlet 25a, to an n-th additional gas mixing control system 27n that supplies the source gases to the n-th additional source gas inlet 25n. This configuration allows for separate control of the flow rates of the source-containing gas R introduced into the reaction chamber 2 through the respective additional source gas inlets.

Similarly to the CVD apparatus 100 in the first embodiment, the CVD apparatus 101 may be used in the production of epitaxial substrates and in the manufacturing of compound semiconductor devices. The method for forming compound semiconductor epitaxial layers with the CVD apparatus 101 is similar to the method described hereinabove that uses the CVD apparatus 100, except that in the present embodiment, portions of the first and the second source gases 8 and 9 and of the dopant gas 10 are added directly to the mixed gas M flowing in the reaction chamber 2.

A simulation was made to study the distributions of the active species concentrations and the effective C/Si ratio in the formation of a SiC epitaxial layer on a SiC substrate with use of the CVD apparatus 101. The simulation method and the results are described below.

In the present embodiment, four additional source gas inlets, namely, the first additional source gas inlet 25a to the fourth additional source gas inlet, are arranged in the reaction chamber 2. The first additional source gas inlet 25a is disposed near the center of the reaction chamber 2 in the gas flow direction f, and the second to the fourth additional source gas inlets are disposed in this order at substantially regular intervals from the center of the reaction chamber 2 toward the downstream side. For example, these additional source gas inlets are made of quarts that is resistant to temperatures experienced in the reaction chamber. To ensure a uniform distribution of the source gases in a direction perpendicular to the gas flow direction f, the plurality of additional source gas inlets are disposed also in the direction perpendicular to the gas flow direction f. The "direction perpendicular to the gas flow direction f" is the depth direction in FIG. 3, specifically, the direction that traverses the gas flow direction f as seen from above the substrate 6.

The conditions under which the first and the second source gases 8 and 9 are supplied in the present embodiment are as follows. The flow rates of silane introduced through the first additional source gas inlet 25a to the fourth additional source gas inlet are set to be five times, five times, one time and one time, respectively, the flow rate of silane introduced into the gas mixing chamber 24 through the source gas inlet 40. Further, the flow rates of propane introduced through the first additional source gas inlet 25a to the fourth additional source gas inlet are set to be one time, one time, three times and ten times, respectively, the flow rate of propane introduced into the gas mixing chamber 24 through the source gas inlet 40.

Similarly to the first embodiment, the distributions of the concentrations of the active species Si and $C_2H_2$ generated by the decomposition of the silane gas and the propane gas were simulated based on the distribution of carrier gas temperature in the reaction chamber 2 of the CVD apparatus 101. The distribution of carrier gas temperature was assumed to be the same as the distribution of carrier gas temperature in the reaction chamber 2 of the CVD apparatus 100 obtained in the first embodiment. The simulation conditions other than the conditions for the supply of the source gases 8 and 9, for example, the preset temperatures of the first and the second susceptors 3 and 22 were the same as in the first embodiment.

Figure 4:
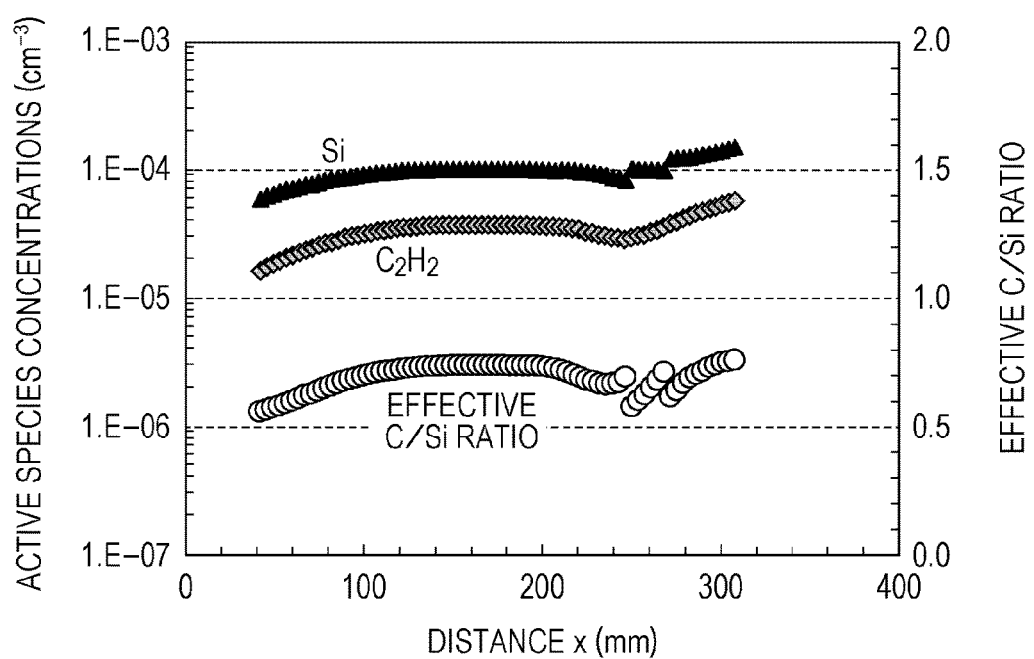
FIG. 4 is a diagram illustrating distributions in the gas flow direction of the concentrations of Si and $C_2H_2$ generated by the decomposition of source gases, and of the effective C/Si ratio in a reaction chamber of the CVD apparatus.

The simulation results are shown in FIG. 4, which illustrates the distributions of the concentrations of the active species Si and $C_2H_2$, and of the effective C/Si ratio calculated based on the active species concentrations.

In the present embodiment, as illustrated in FIG. 4, the distribution of the effective C/Si ratio is more uniform than the distribution of the effective C/Si ratio in the case of using the conventional CVD apparatus 200 (FIG. 10) over the entire region on the substrate holder 5. In the example using the conventional CVD apparatus 200, the difference in the effective C/Si ratio in the entire region on the substrate holder 5 is 0.58. In the present embodiment, in contrast, the effective C/Si ratio in the entire region on the substrate holder 5 is 0.56 at minimum and 0.76 at maximum, with the difference being 0.20. Thus, the distribution of the effective C/Si ratio is markedly enhanced as compared to the conventional level. In the present embodiment, further, the distribution of the effective C/Si ratio in the region from the midpoint B of the substrate holder 5 in the gas flow direction f to the downstream end (the downstream region) is shown to be enhanced over the distribution of the effective C/Si ratio in the first embodiment (FIG. 2).

In the present embodiment, as discussed above, a further enhancement may be obtained in the uniformity of the distribution of the effective C/Si ratio on the compound semiconductor substrate in the entire region on the substrate holder 5, resulting in an enhancement in the uniformities of the thickness and the impurity concentration of the epitaxial layer formed on the compound semiconductor substrate. Accordingly, an epitaxial layer having a higher level of uniformity may be formed irrespective of the location in which the substrate 6 is set on the substrate holder 5.

While the present embodiment illustrates the reaction chamber 2 as having four additional source gas inlets, the effects described above may be obtained by providing at least one additional source gas inlet. Further, the effective C/Si ratio may be controlled with higher accuracy by providing five or more additional source gas inlets, and the accuracy may be further increased by providing six or more additional source gas inlets.

The CVD apparatuses used in the present disclosure are not limited to the CVD apparatuses 100 and 101 illustrated in FIGS. 1 and 3. Further, the methods for forming epitaxial layers according to the present disclosure are not limited to those described in the embodiments discussed above.

Figure 12:
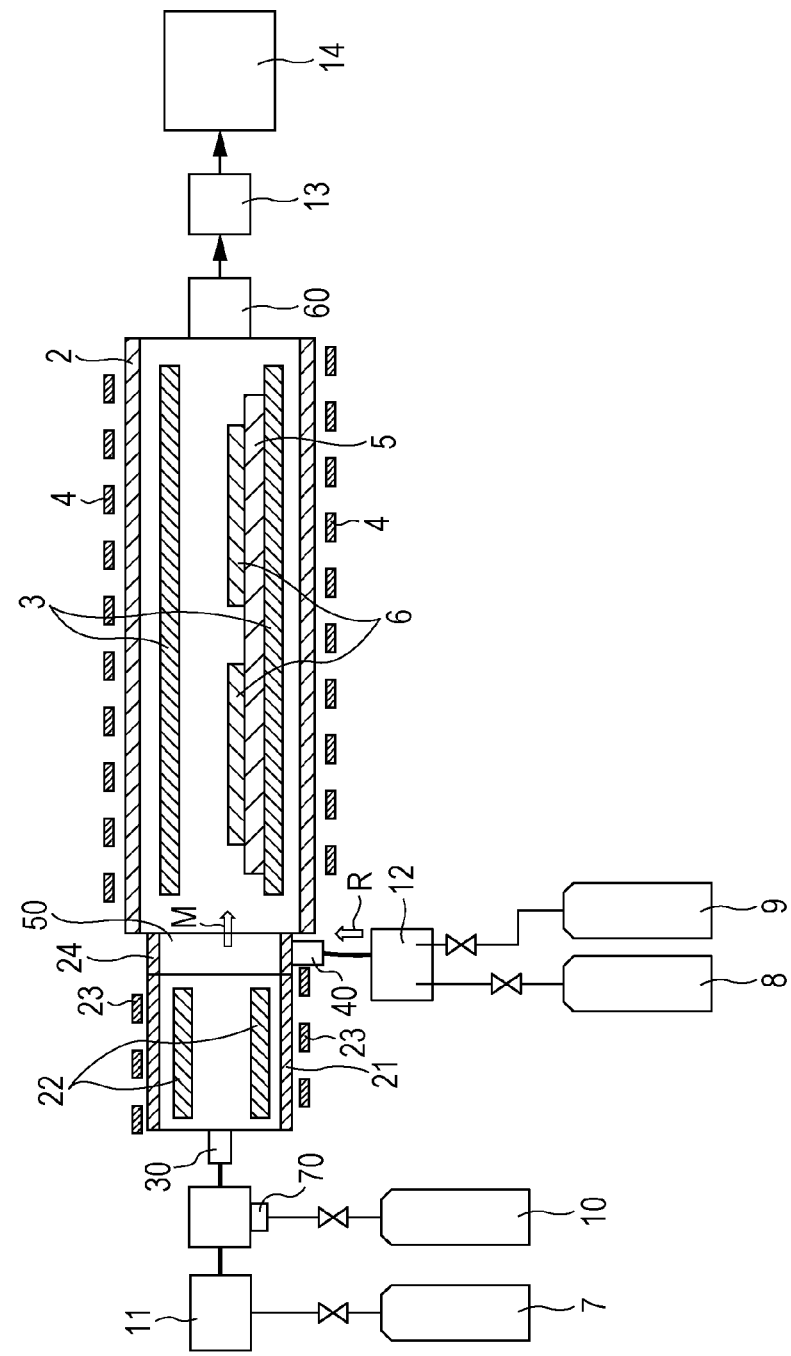
FIG. 12 is a view illustrating another example of the CVD apparatus according to the first embodiment.

While the carrier gas 7 alone is heated beforehand in the first and the second embodiments, a gas other than the source gases, for example, the dopant gas 10, may be heated at the same time with the carrier gas 7. As illustrated in FIG. 12, a CVD apparatus 102 may be used in the present disclosure. The CVD apparatus 102 includes a dopant gas inlet 70 disposed upstream from the carrier gas inlet 30. With this configuration, the dopant gas 10 is added to the carrier gas 7 that is not still heated, through the dopant gas inlet 70, and both the carrier gas 7 and the dopant gas 10 are heated in the carrier gas heating chamber 21. Although not illustrated, the CVD apparatus 101 may further include such a dopant gas inlet 70.

While the CVD apparatuses 100, 101 and 102 are configured to heat the inside of the carrier gas heating chamber 21 and the inside of the reaction chamber 2 by induction heating with the susceptors and the induction coils, the heating may be performed by other method. The carrier gas heating chamber 21 and the reaction chamber 2 may include heating units other than the susceptors and the induction coils.

While the CVD apparatuses 100, 101 and 102 have the gas mixing chamber 24 disposed at an end of the reaction chamber 2, the gas mixing chamber 24 may be disposed on top of the reaction chamber 2. For example, the gas mixing chamber 24 and the mixed gas inlet 50 may be arranged on top of a central area of the reaction chamber 2 in the gas flow direction f. In this case, the apparatus may be configured so that the mixed gas M is introduced into the reaction chamber 2 from above the central area of the reaction chamber 2 and is passed in two directions toward both ends of the reaction chamber 2. The same effects as described above may be obtained in this case too.

The CVD apparatuses 100, 101 and 102 may further include a mechanism that rotates the substrate holder 5. While the embodiments described above illustrate the epitaxial layer as being formed without the rotation of the substrate holder 5, the epitaxial layer may be formed while rotating the substrate holder 5. In this case, the uniformity of the epitaxial layer is further enhanced.

While the above embodiments illustrate transverse CVD apparatuses, the technique may be applied also to vertical CVD apparatuses. That is, the distribution of gas temperature in the reaction chamber of a vertical CVD apparatus may be reduced while ensuring a sufficient speed of the growth of the compound semiconductor by mixing the preliminarily heated carrier gas with the source gases. Further, the condition in which the substrate is disposed in the transverse or vertical CVD apparatus may be other than horizontal. For example, the substrate may be set in the vertical direction in the reaction chamber, and the source gases may be passed in parallel to the surface of the substrate. A small distribution of gas temperature in the gas flow direction f may be achieved even with this configuration, and the formation of epitaxial layers with enhanced uniformity is possible.

The source gases used in the formation of SiC epitaxial layers in the above embodiments are not limited to silane and propane. For example, the source gases may be dilutions of silane and propane with, for example, hydrogen. The similar effects may be obtained even when other kinds of source gases are used.

The compound semiconductors epitaxially grown on the substrates are not limited to SiC. For example, other wide bandgap semiconductors such as GaN and AlN may be grown. When a compound semiconductor other than SiC is to be grown, gases including the elements of the target compound semiconductor may be selected appropriately as the source gases. The substrates 6 on which the compound semiconductor epitaxial layers are formed may be compound semiconductor substrates including compound semiconductors or may be other types of semiconductor substrates such as Si substrates.

The methods for manufacturing the epitaxial substrates in the embodiments of the present disclosure are not limited to those described in the first and the second embodiments. For example, the heating of the carrier gas may be performed outside the CVD apparatus. Further, the apparatuses used in the manufacturing of the epitaxial substrates are not limited to the CVD apparatuses 100, 101 and 102, and any apparatuses capable of performing the methods may be used appropriately.

The embodiments discussed in the present disclosure should be construed as illustrative and not as limiting in all aspects. The scope of the present disclosure is not limited to the embodiments discussed above, but is defined by the appended claims and embraces equivalents to the claims and all modifications within the scope of the disclosure.

What is claimed is:

1. A method comprising:
    providing a substrate in a reaction chamber;
    heating a carrier gas in a heating chamber connected to the reaction chamber;
    preparing a mixed gas in a mixing chamber by mixing the heated carrier gas with a source gas that is a source for a compound semiconductor, the source gas having a lower temperature than the heated carrier gas; and forming a compound semiconductor epitaxial layer on the substrate by supplying the mixed gas onto the substrate, wherein an angle formed between a surface of the substrate and a flow direction along which the mixed gas flows in the reaction chamber is 0° to 10°.

2. The method according to claim 1, wherein the carrier gas is heated to a temperature of 1600° C. to 1750° C.

3. The method according to claim 1, wherein the source gas is also supplied onto the substrate directly into the reaction chamber without being mixed with the carrier gas.

4. The method according to claim 1, further comprising: adding a dopant gas to the carrier gas before the heating of the carrier gas, wherein the heating the carrier gas includes heating the carrier gas together with the dopant gas.

5. The method according to claim 1, wherein the carrier gas is hydrogen gas.

6. The method according to claim 1, wherein at least a portion of the source gas is decomposed during the production of the mixed gas by the mixing of the heated carrier gas with the source gas.

7. The method according to claim 1, wherein the substrate is a silicon carbide substrate and the compound semiconductor epitaxial layer is a silicon carbide epitaxial layer.

8. The method according to claim 1, wherein the heating chamber, the mixing chamber and the reaction chamber are arranged in the flow direction.

9. The method according to claim 1, wherein the source gas includes a silane gas and a gas including carbon.

* * * * *